(12) United States Patent
Azam et al.

(10) Patent No.: US 6,753,228 B2
(45) Date of Patent: Jun. 22, 2004

(54) METHOD OF FORMING A LOW RESISTANCE SEMICONDUCTOR DEVICE AND STRUCTURE THEREFOR

(75) Inventors: Misbahul Azam, Gilbert, AZ (US); Jeffrey Pearse, Chandler, AZ (US); Daniel G. Hannoun, Chandler, AZ (US)

(73) Assignee: Semiconductor Components Industries, L.L.C., Phoenix, AZ (US)

(*) Notice: Subject to any disclaimer, the term of this patent is extended or adjusted under 35 U.S.C. 154(b) by 0 days.

(21) Appl. No.: 10/270,419

(22) Filed: Oct. 15, 2002

(65) Prior Publication Data

US 2004/0070028 A1 Apr. 15, 2004

(51) Int. Cl.[7] .......................................... H01L 21/8242
(52) U.S. Cl. ............................... 438/270; 438/272
(58) Field of Search ........................ 438/270, 272, 438/242, 259

(56) References Cited

U.S. PATENT DOCUMENTS

| | | | |
|---|---|---|---|
| 4,145,703 A | | 3/1979 | Blanchard et al. |
| 4,767,722 A | | 8/1988 | Blanchard et al. |
| 5,034,785 A | | 7/1991 | Blanchard et al. |
| 6,251,730 B1 | * | 6/2001 | Luo .......................... 438/270 |
| 2002/0137291 A1 | * | 9/2002 | Zandt In't et al. .......... 438/270 |

FOREIGN PATENT DOCUMENTS

| WO | WO0003427 | 1/2000 | ......... H01L/21/336 |
|---|---|---|---|

* cited by examiner

Primary Examiner—Wael Fabomy
Assistant Examiner—Ginette Peralta
(74) Attorney, Agent, or Firm—Robert F. Hightower

(57) ABSTRACT

A transistor (10) is formed with a low resistance trench structure that is utilized for a gate (17) of the transistor. The low resistance trench structure facilitates forming a shallow source region (49) that reduces the gate-to-source capacitance.

8 Claims, 5 Drawing Sheets

US 6,753,228 B2

METHOD OF FORMING A LOW RESISTANCE SEMICONDUCTOR DEVICE AND STRUCTURE THEREFOR

BACKGROUND OF THE INVENTION

The present invention relates, in general, to electronics, and more particularly, to methods of forming semiconductor devices and structure.

In the past, the semiconductor industry utilized various methods to form the gate of MOS transistors. One particular technique formed a trench within a semiconductor substrate and formed the gate material within the trench. The gate material was recessed below the surface of the semiconductor substrate in order to provide a planar surface for building other portions of the transistor. Such a method is disclosed in U.S. Pat. No. 5,034,785 issued to Richard Blanchard on Jul. 23, 1991. One problem with such techniques was the resistance of the gate. The resistance of the gate of such transistors was sufficiently high to limit the switching speed of the transistor thereby limiting the applications in which the transistors were used. Another limitation was the gate-to-source capacitance. The source typically extended to a large depth into the substrate thereby forming a large surface area along the gate oxide. This large surface area resulted in a large gate-to-source capacitance that further limited the switching speed.

Accordingly, it is desirable to have a method of forming a semiconductor device that results in a low gate resistance and a low gate-to-source capacitance.

DESCRIPTION OF THE DRAWINGS

For simplicity and clarity of illustration, elements in the figures are not necessarily to scale, and the same reference numbers in different figures denote the same elements. Additionally, descriptions and details of well known steps and elements are omitted for simplicity of the description.

DETAILED DESCRIPTION OF THE DRAWINGS

The present descriptions include a method of forming a portion of an MOS transistor having a low resistance trench element or low resistance trench structure thereby improving the switching speed and a method of forming another portion of the MOS transistor having a shallow source thereby lowering the gate-to-source capacitance of the transistor and further improving the switching speed.

Figure 1:
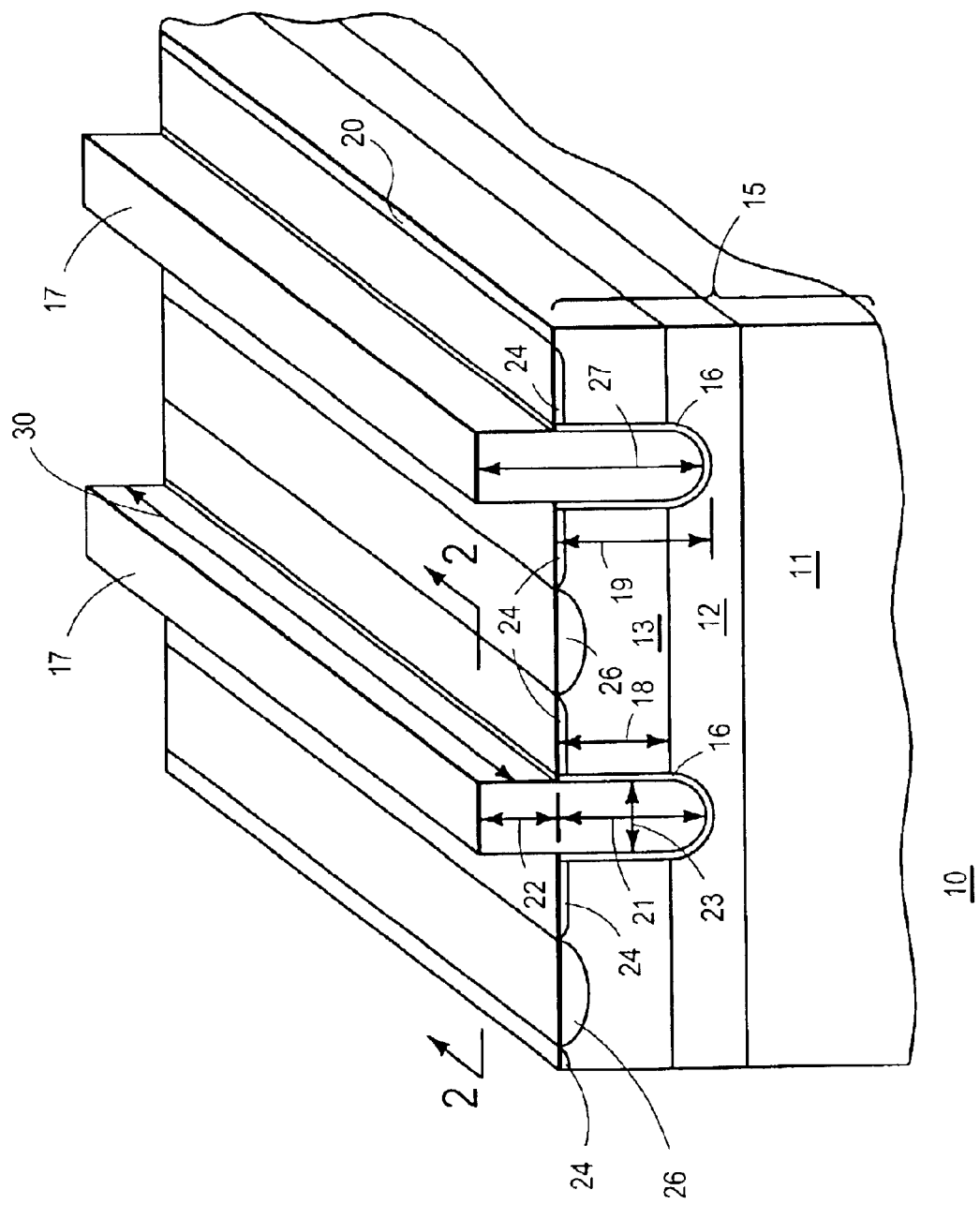
FIG. 1 schematically illustrates an enlarged isometric portion of an embodiment of a semiconductor transistor in accordance with the present invention.

FIG. 1 schematically illustrates an enlarged isometric portion of an embodiment of a semiconductor device that has a low resistance trench structure. The low resistance trench structure functions as a gate of an MOS transistor 10 and provides transistor 10 a low gate resistance, low gate-to-source capacitance, and hence increased switching performance. Transistor 10 is formed on a semiconductor substrate 15. Semiconductor substrate 15 typically is a composite substrate that includes a bulk substrate 11 of a first conductivity type, a conduction layer 12 that is formed of the first conductivity type on a surface of bulk substrate 11, and a first region 13 of a second conductivity type formed on at least a portion of layer 12. In the preferred embodiment, region 13 functions as a body of transistor 10. Also in the preferred embodiment, transistor 10 is a P-channel transistor having a P-type bulk substrate 11 and layer 12, and an N-type region 13. In this preferred embodiment, region 13 typically is connected to the highest voltage applied to transistor 10. First region 13 may be formed by various well-known techniques including forming an epitaxial layer on layer 12 or by doping a portion of layer 12. In other embodiments, substrate 15 may be a bulk substrate or have other layers on a surface of a bulk substrate.

Transistor 10 is formed to have an extended gate 17 that is formed to extend an extension distance 22 out of substrate 15 and a depth 21 into substrate 15. Distance 22 typically is no greater than fifty percent (50%) of depth 21 but may be greater or less in some embodiments. Distance 22 and depth 21 form a height 27 of gate 17 and each generally are illustrated by an arrow. Gate 17 is also formed to extend laterally a distance 30 across substrate 15. Transistor 10 typically has a plurality of gates 17 to provide increased current carrying capability. Each extended gate 17 typically is formed by creating an opening or a trench extending into substrate 15 from a surface 20 of substrate 15. The opening or trench is formed to have a depth 19 into substrate 15 and to extend at least distance 30 across surface 20. In the preferred embodiment, depth 19 is no less than a thickness 18 of region 13. A gate insulator 16 is formed along the sidewalls of the opening. In the preferred embodiment, insulator 16 is silicon dioxide. A gate material is then disposed in the opening to form gate 17. The gate material typically is a conductor and may be a variety of materials including a metal, polysilicon, doped polysilicon, a silicide, a salicide, or tungsten silicide. In the preferred embodiment the gate material is doped polysilicon. Each gate 17 typically has a plurality of source regions or sources 24 with each source 24 formed on an opposite side of each gate 17. Each source 24 extends from surface 20 into substrate 15 and typically abuts insulator 16. A body contact 26 is formed on surface 20 and extends into substrate 15 and may abut each source 24. Contact 26 will facilitate forming electrical contact to the body of transistor 10.

Forming gate 17 to extend extension distance 22 out of substrate 15 increases the cross-sectional area and lowers the resistance of gate 17 thereby improving the switching characteristics of transistor 10. The resistance of gate 17 is inversely proportional to the cross-sectional area of gate 17. The cross-sectional area is width 23 multiplied by height 27. Extension distance 22 increases height 27 thereby increasing the cross-sectional area and lowering the resistance of gate 17. To obtain the lowest resistance for gate 17, extension distance 22 is formed across all of distance 30. However, the resistance can be improved by forming distance 22 along only a portion of distance 30. Typically distance 22 is formed along at least twenty percent (20%) of distance 30 and preferably along at least fifty percent (50%) of distance 30.

The amount of the periphery of gate 17 that is within substrate 15 forms a capacitance between gate 17 and other elements of transistor 10. This capacitance affects the switching performance of transistor 10. The reduced resistance provided by extended gate 17 offsets the capacitance and improves the switching performance. Additionally, extending gate 17 out of substrate 15 facilitates reducing depth 21 and correspondingly thickness 18 thereby reducing the capacitance while still maintaining the low resistance of gate 17 thereby further improving the switching performance.

Figure 2:
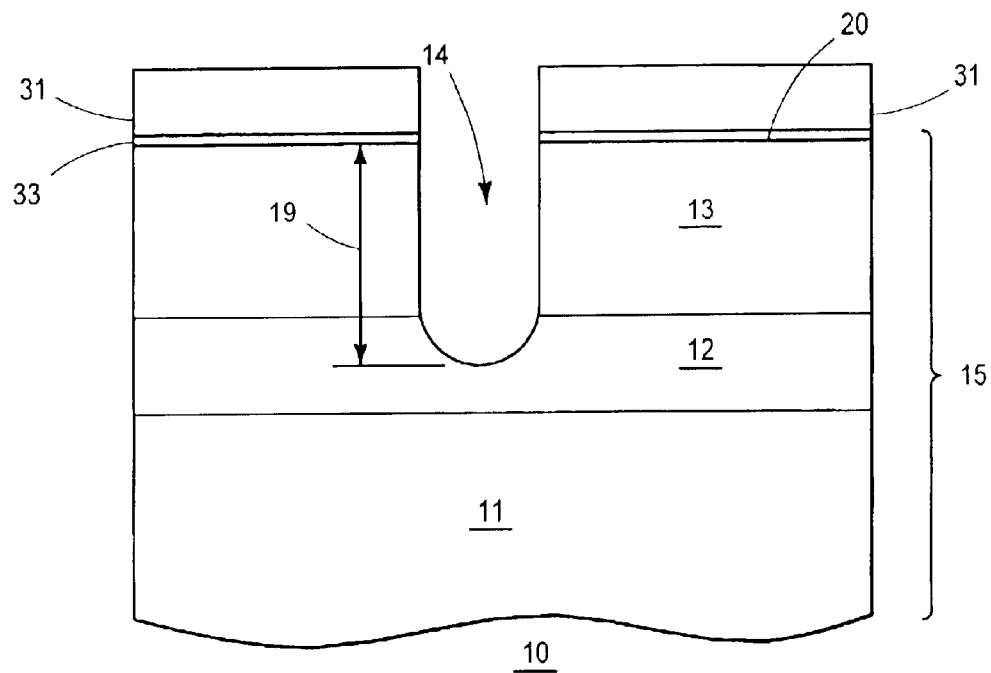
FIGS. 2–3 schematically illustrate cross-sectional portions of the transistor of FIG. 1 at various manufacturing stages according to an embodiment of a method of formation in accordance with the present invention.
Figure 3:
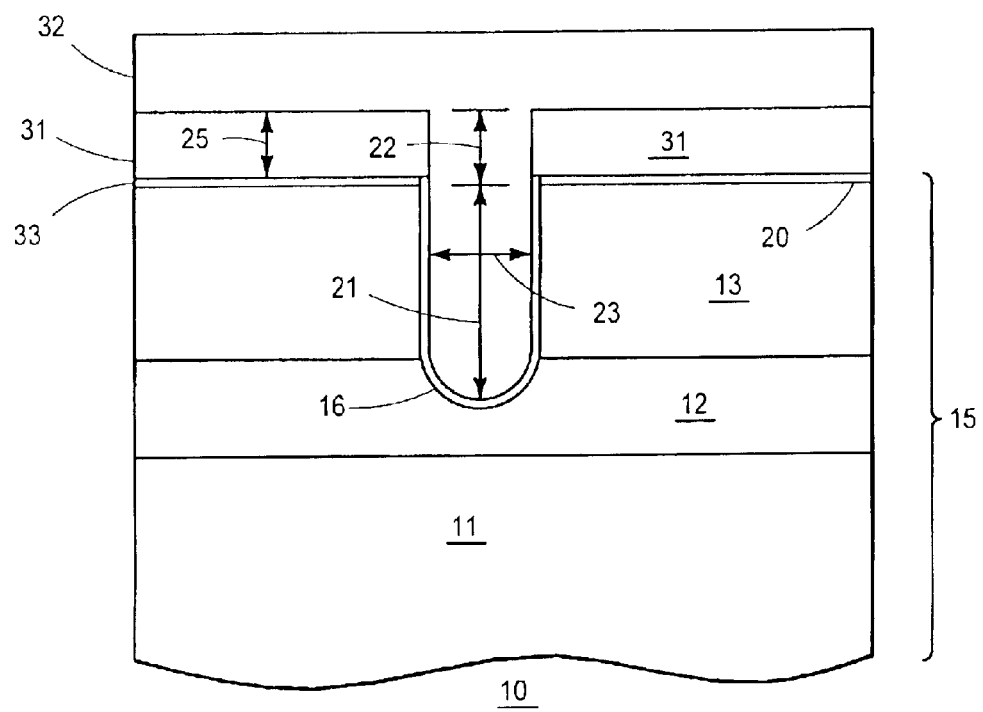

FIG. 2 through FIG. 3 schematically illustrate some steps in an embodiment of a method of forming a portion of transistor 10.

FIG. 2 schematically illustrates a cross-sectional portion of transistor 10 along the section line 2—2 of FIG. 1 at an early stage in an embodiment of a method of forming gate 17. An opening 14 is formed for each gate 17 that is formed for transistor 10, thus, a plurality of openings are formed as illustrated by the configuration shown in FIG. 1 although only one opening 14 is shown in FIG. 2 for simplicity of the explanation. To facilitate forming opening 14, an insulator 33 is formed on surface 20 of substrate 15. In the preferred embodiment, substrate 15 is oxidized to form a silicon dioxide insulator 33. A mask 31 is applied on insulator 33 to protect insulator 33 during subsequent processing operations. Openings are formed through mask 31 and through insulator 33 at positions where openings 14 are desired. As illustrated in FIG. 3, mask 31 is formed to have a thickness 25 so that thickness 25 plus the thickness of insulator 33 on surface 20 is substantially equal to distance 22. Each opening 14 is formed extending from surface 20 into substrate 15 to depth 19 by techniques that are well known to those skilled in the art. Depth 19 is generally illustrated by an arrow. Each opening 14 generally is formed as a trench having substantially vertical sidewalls although the sidewalls may have other shapes. Each trench has a width that is typically less than about fifty percent (50%) of depth 19 although the width may be different in other embodiments.

FIG. 3 schematically illustrates the portion of transistor 10 shown in FIG. 2 at a subsequent manufacturing stage. After forming openings 14, insulator 16 is formed on the interior surface of opening 14 including along the sidewalls and the bottom of opening 14. In the preferred embodiment, substrate 15 is oxidized to form a silicon dioxide insulator 16. A layer 32 of the gate material is applied to completely fill the remainder of opening 14 and to extend out past mask 31. The portion of layer 32 that extends past the opening in mask 31 is removed leaving gate material within, and preferably filling, the opening through mask 31 and filling the remainder of opening 14 to form gate 17. A portion of layer 32 may be removed past the level of mask 31, but the amount preferably is small relative to thickness 25 and distance 22. Mask 31 and insulator 33 are removed leaving gate 17 extending distance 22 from surface 20 and leaving insulator 16 lining the interior surface of opening 14 (see FIG. 1). Those skilled in the art will realize that other methods and other manufacturing steps and sequences of steps may be utilized to form gate 17 and that the sequence of steps explained in the description of FIGS. 2 and 3 is one example of such steps.

The low resistance trench structure of insulator 16 and gate 17 may also be used for other purposes than forming a low resistance gate. For example the low resistance trench structure may be used for forming low resistance trench capacitors, or a Schottky barrier diode, or other devices that have a lateral current flow and require a low resistance.

FIGS. 4–9 schematically illustrate other cross-sectional portions of transistor 10 of FIG. 1 at various manufacturing stages including stages of forming a shallow source region for transistor 10 according to another embodiment of a method of formation.

Figure 4:
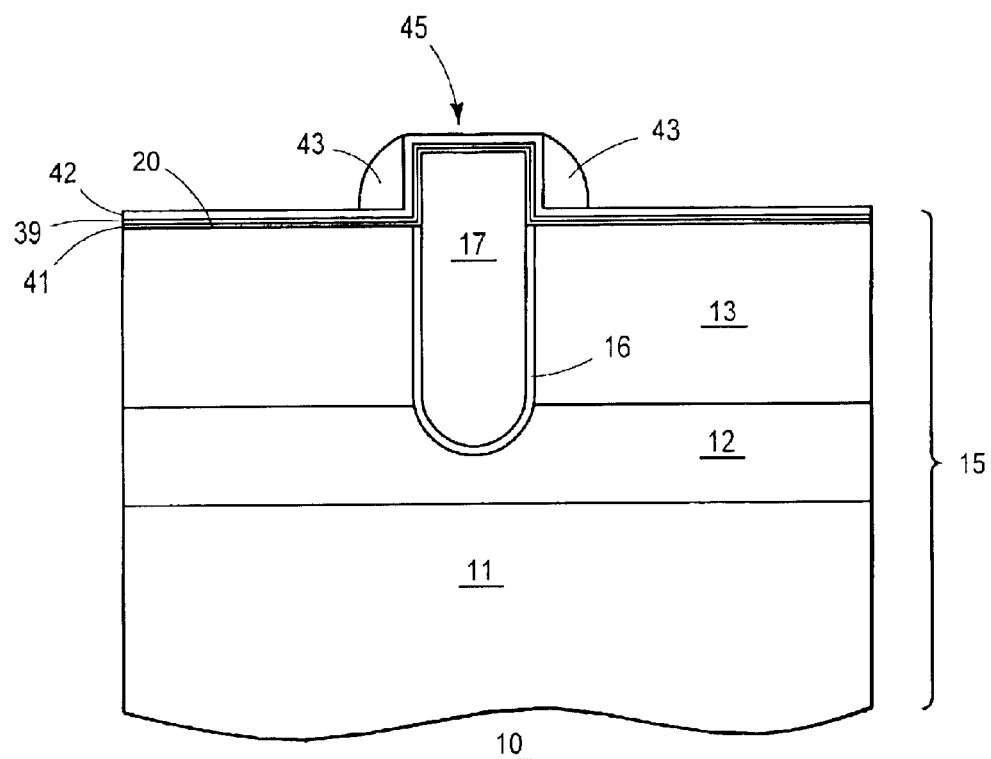
FIGS. 4–9 schematically illustrate other cross-sectional portions of the transistor of FIG. 1 at various manufacturing stages according to another embodiment of a method of formation in accordance with the present invention.

FIG. 4 schematically illustrates a cross-sectional portion of transistor 10 along the section line 2—2 of FIG. 1 at a stage in another embodiment of a method of forming portions of transistor 10. After forming extended gate 17, gate 17 is used as an alignment pin to assist in forming a self-aligned shallow source and a self-aligned body contact for transistor 10. A first selective mask layer 41 is formed on surface 20 and covering gate 17. A second selective mask layer 39 is formed on first selective mask layer 41 and a third selective mask layer 42 is formed on second selective mask layer 39. Layers 39, 41, and 42 are formed from materials that facilitate using the layers as etch stops in subsequent processing steps in the formation of transistor 10. In the preferred embodiment, layer 41 is a thin layer of silicon dioxide having a thickness of between five (5) and fifty (50) nanometers and preferably is approximately ten (10) nanometers thick in order to facilitate using a portion of layer 42 as a mask as will be seen hereinafter. Also in this preferred embodiment, layer 42 is a layer of silicon nitride having a thickness of about twenty (20) to one hundred fifty (150) nanometers and preferably is approximately one hundred (100) nanometers thick in order to facilitate functioning as an etch stop and as part of an oxidation mask as will be seen hereinafter. Additional, in this preferred embodiment layer 39 is a layer of polysilicon in order to form a poly-buffered LOCOS (Local Oxidation Of Silicon) structure to facilitate a LOCOS oxidation operation that is to be subsequently performed. Layer 39 typically has a thickness no greater than about ten nano-meters (10 nano-meters) in order to provide the desired buffering. The thickness of layer 39 is as thin as possible to provide the desired etch stop characteristics and still not impede doping of underlying material and preferably is no greater than about five nano-meters (5 nano-meters). Those skilled in the art will understand that layer 39 may be omitted in some embodiments, however, the polysilicon layer is subsequently utilized as an etch stop however other techniques may be used to terminate that particular etch. The portions of layers 39, 41 and 42 covering gate 17 form a pedestal 45, illustrated generally by an arrow. Spacers 43 are formed on portions of layer 42 that overlie substrate 15 and are adjacent to pedestal 45 in addition to being formed on pedestal 45, including along side-walls of pedestal 45. In the preferred embodiment, spacers 43 are formed substantially coplanar with the top of pedestal 45 so that spacers 43 do not cover the top of pedestal 45 thereby exposing layer 42 on the top of gate 17. Spacers 43 and pedestal 45 will subsequently function as a mask that facilitates forming a shallow source and self-aligning the source and the body contact to gate 17. Spacers 43 are formed from a material that is not etched during the etching of the material used for layer 42. In the preferred embodiment, spacers 43 are formed from polysilicon. Spacers 43 are formed by techniques that are well known to those skilled in the art.

Figure 5:
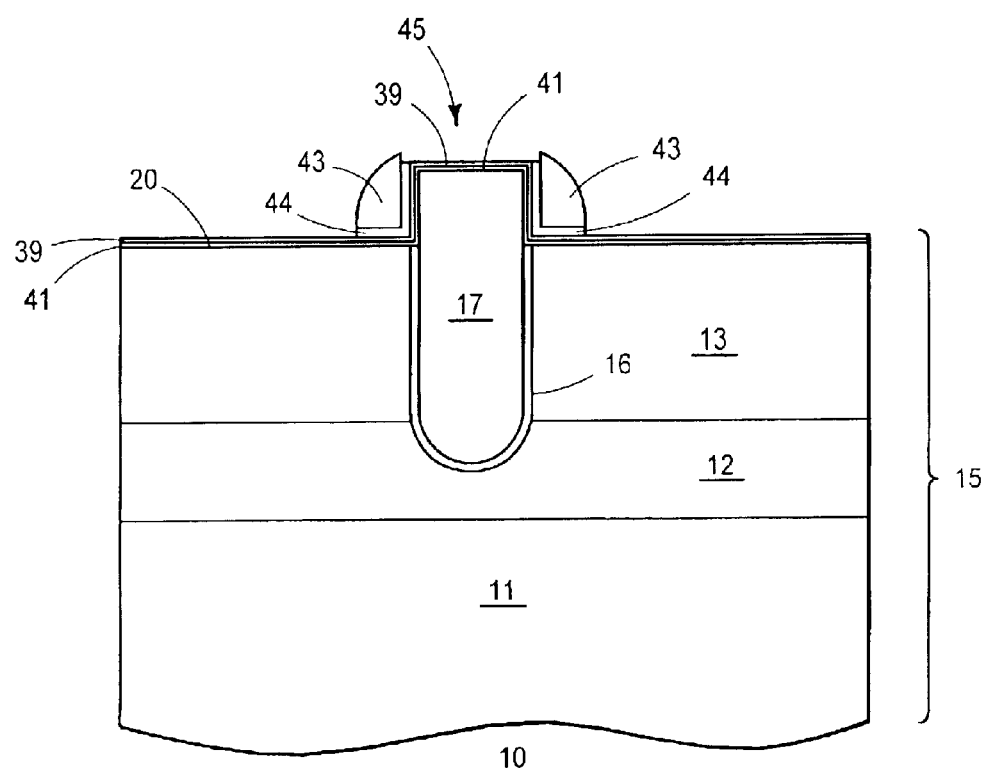

FIG. 5 schematically illustrates the portion of transistor 10 shown in FIG. 4 at a subsequent manufacturing stage. A first portion or exposed portions of layer 42 are removed including portions that are exposed on the top of pedestal 45. The first portion of layer 42 is removed by a selective etch that does not remove the material used for forming spacers 43 and layer 39, thus, layer 39 protects the top of gate 17 and functions as an etch stop during the removal of the first portion of layer 42. In the preferred embodiment, a dry nitride etch or plasma etch is utilized. A second portion of layer 42 is protected by spacers 43 and remains after removing the first portion and forms an oxidation mask 44 that will be used during subsequent steps. After removing the first portion of layer 42, layers 39 and 41 remain, preferably covering surface 20 and the top of gate 17.

Figure 6:
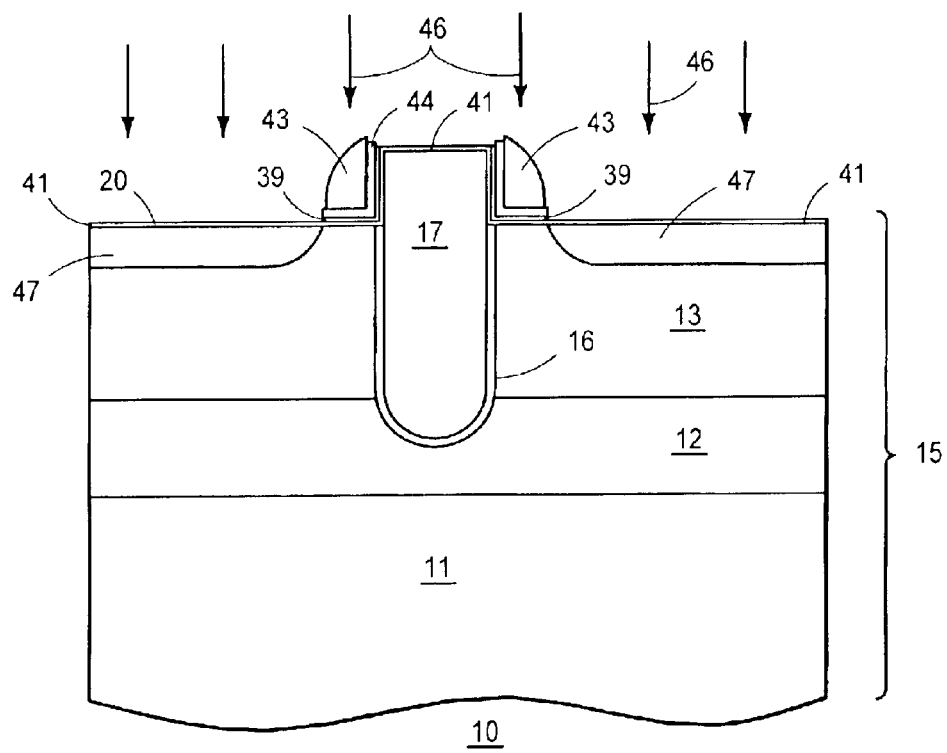

FIG. 6 schematically illustrates the portion of transistor 10 shown in FIG. 5 at a subsequent manufacturing stage. A first portion or exposed portions of layer 39 are removed by a process that does not affect the material utilized for forming layers 41 and 42 thereby exposing a first portion of layer 41 having an underlying first portion or body portion of substrate 15. A second portion of layers 39 and 41 remain covered by mask 44. In the preferred embodiment, a dry polysilicon etch is utilized to remove layer 39 which also removes a portion of spacers 43 making them smaller as shown by the difference in size shown between FIG. 5 and FIG. 6. Gate 17, mask 44, and spacers 43 form a body mask that defines a body contact area and is used to form a body contact region 47 on surface 20 and extending into substrate 15. Body contact region 47 may be formed by a variety of methods that are well known to those skilled in the art such as diffusion or implantation techniques. Arrows 46 illustrate dopants that are formed in region 47 through the first portion of layer 41. Spacers 43 and mask 44, in addition to layers 39, 41, and 42, protect an underlying source portion of substrate 15 from the dopants used in forming region 47.

Figure 7:
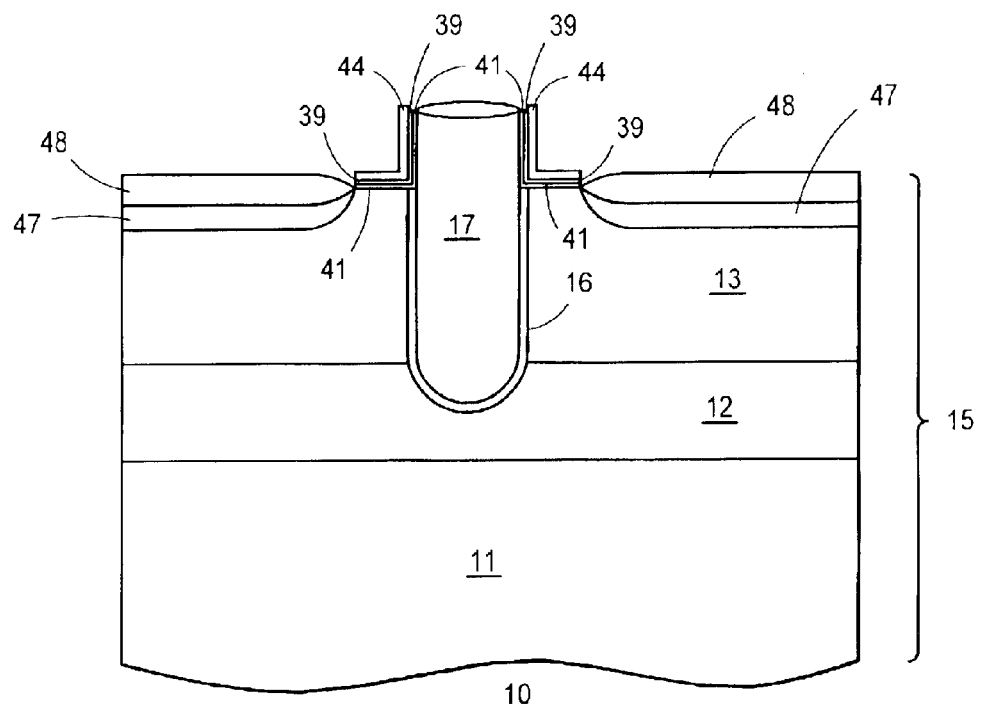

FIG. 7 schematically illustrates the portion of transistor 10 shown in FIG. 6 at a subsequent manufacturing stage. Spacers 43 are removed by a selective etching step that does not affect the material used for forming mask 44 or layer 41. In the preferred embodiment a dry polysilicon etch is used. The portion of layer 41 on the top of gate 17 protects gate 17 during the removal of spacers 43 and the first portion of layer 41 protects the underlying first portion of substrate 15 during the removal. After removing spacers 43, a first portion or exposed portions of layer 41 and underlying portions of surface 20 or the body portion of surface 20, is oxidized to form a thick oxide 48 overlying body contact region 47. Those skilled in the art will realize that the peak doping profile of region 47 should be deeper than the depth of the oxidation used to form oxide 48. During this operation the portion of layer 41 on top of gate 17 is also oxidized to form a thick oxide. As will be seen hereinafter, oxide 48 has a thickness that is greater than the thickness of the second portion of layer 41 in order to form a differential mask that is subsequently utilized to form a source region of transistor 10.

Figure 8:
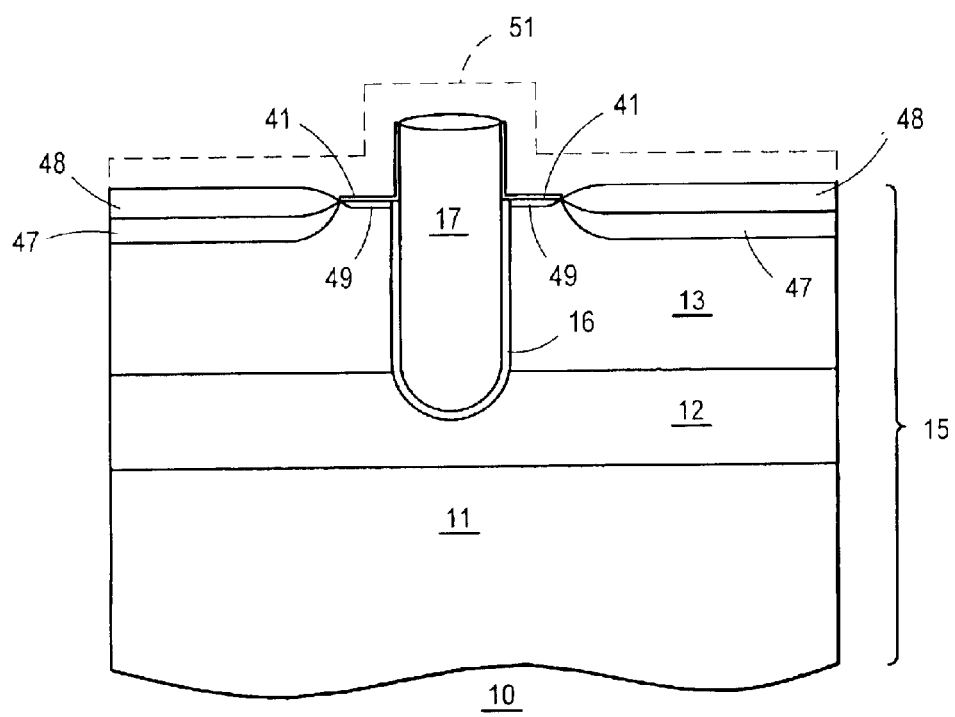

FIG. 8 schematically illustrates the portion of transistor 10 shown in FIG. 7 at a subsequent manufacturing stage. Mask 44 is removed by a selective etching process that does not remove the material utilized for forming layer 39. Thereafter, the remaining portion of layer 39 is removed by a process that does not remove the material utilized for forming layer 41 thereby leaving the second portion of layer 41 that was covered by mask 44 on surface 20 and that was on the sidewalls of gate 17 that extend past surface 20. Oxide 48 and the second portion of layer 41 function as the differential mask that is utilized for forming a source region or source 49 extending from surface 20 a first distance into substrate 15 and typically abutting insulator 16. Source 49 may also abut region 47. Source 49 is typically formed to have a depth that is less than approximately 300 nanometers and preferably is between fifty and one hundred nanometers (50–100 nm). This shallow depth of source 49 minimizes the area of source 49 that contacts insulator 16 thereby minimizing the gate-to-source capacitance of transistor 10 and improving the switching performance. Extending gate 17 out past surface 20 ensures that there is an overlap between source 49 and gate 17 regardless of the depth of source 49 thereby facilitating forming such a shallow depth for source 49. Source 49 maybe formed by a variety of techniques that are well known to those skilled in the art including diffusion and implanting.

In the preferred embodiment, a solid dopant source, illustrated in phantom by dashed lines 51, having the same dopant type as that of bulk substrate 11 is formed overlying oxide 48, the second portion of layer 41, and gate 17. The differential oxide mask of oxide 48 and the second portion of layer 41 is used while dopants from the solid dopant source are diffused to form source 49. In this preferred embodiment, the dopant is boron. It is typically difficult to control the depth of boron dopants. However, using the solid boron dopant source provides added control. Additionally, using the differential oxide mask for protecting a portion of substrate 15 while diffusing through the second portion of layer 41 of the differential oxide mask further increases the control. The thickness of oxide 48 typically is greater than the thickness of the second portion of layer 41 so that dopants utilized to form source 49 cannot penetrate oxide 48. Preferably oxide 48 is at least five times thicker than the second portion of layer 41. In the preferred embodiment, the second portion of layer 41 has a thickness of approximately ten (10) nanometers and oxide 48 has a thickness of approximately fifty (50) nanometers. In other embodiments, the differential mask may be used for a mask while dopants are implanted to form source 49.

Figure 9:
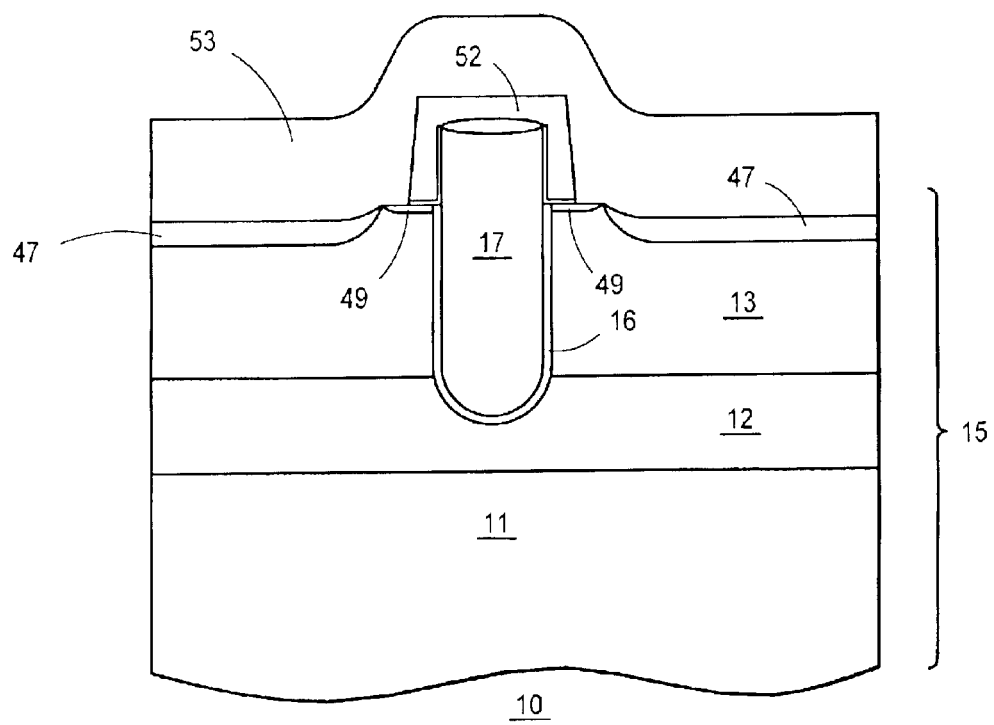

FIG. 9 schematically illustrates the portion of transistor 10 shown in FIG. 8 at a subsequent manufacturing stage. After forming source 49, thick oxide 48 generally is removed to facilitate forming contact to region 47. In the preferred embodiment, the surface of transistor 10 is etched to remove oxide 48. During this operation, a portion of layer 41 typically is removed. A dielectric 52 is formed to cover the exposed portion of gate 17 to isolate gate 17. Thereafter, a source electrode 53 is formed on oxide 48, source 49, and overlying dielectric 52 in order to form electrical contact to source 49 and body region 47.

It should be noted that mask 44 may be formed from a layer similar to layer 42 and that and spacers 43 may be formed on such a mask 44 without the use of layers 39 and 41. Mask 44 would be used to form body regions 47 and thick oxide 48 may still be formed as a mask facilitating the formation of shallow source 49.

Those skilled in the art will recognize that forming source 49 at a shallow depth facilitates decreasing thickness 18 thereby reducing the capacitance of transistor 10. Those skilled in the art will also recognize that the method of forming source 49 at a shallow depth and self-aligned to gate 17 does not require the gate material used to form extended gate 17 but may be formed by any other structure that extends from surface 20 and about which source 49 is formed. Other materials may be used to for such a structure including a dielectric such as silicon nitride, or a silicide, or another type of conductor layer such as tungsten silicide or tungsten silicide doped with nitride may be formed in an opening in surface 20, and mask 44, region 47, and source 49 may be formed using such as the alignment pin.

In view of all of the above, it is evident that a novel device and method is disclosed. Included, among other features, is forming a low resistance gate from a low resistance trench structure to lower the resistance and improve the transistor's switching performance. The method of forming the source region for the extended gate provides a shallow source region that lowers the transistor capacitance and further improves the switching performance. The method typically requires two less photolithography steps than other methods thereby reducing the costs. The method also improves the packing density thereby reducing the die size for a particular transistor and further reducing the costs.

While the invention is described with specific preferred embodiments, it is evident that many alternatives and variations will be apparent to those skilled in the semiconductor arts. More specifically the invention has been described for a particular P-channel MOS transistor structure, although the method is directly applicable to N-channel MOS transistors, as well as to MOS, BiCMOS, metal semiconductor FETs (MESFETs), HFETs, and other transistor structures, in addition to other structures that utilize a low resistance trench structure or that require a shallow source region.

What is claimed is:

1. A method of forming an MOS transistor comprising:
   providing a semiconductor substrate of a first conductivity type having a surface;
   forming an opening extending into the semiconductor substrate;
   forming an alignment pin in the opening and extending a distance out of the opening past the surface;
   forming a first mask on sidewalls of the alignment pin and on at least a first portion of the surface around the alignment pin and not on a second portion of the surface;
   forming spacers on the first mask;
   using the spacers as a second mask while doping the semiconductor substrate underlying the second portion of the surface;
   oxidizing the second portion of the surface to form a thick oxide;
   removing the spacers and the first mask; and
   using the thick oxide as a mask while doping the semiconductor substrate underlying the first portion of the surface.

2. The method of claim 1 wherein forming the alignment pin in the opening and extending the distance out of the opening past the surface includes forming an extended gate in the opening and extending the distance out of the opening past the surface.

3. The method of claim 2 further including forming a gate insulator in the opening between the extended gate and the semiconductor substrate.

4. The method of claim 1 wherein forming the first mask includes forming a first layer on the surface and on the sidewalls of the alignment pin, forming a second layer on the first layer, forming a third layer on the second layer, and removing portions of the first layer, the second layer, and the third layer that are not covered by the spacers.

5. The method of claim 4 wherein forming the first layer includes forming a silicon dioxide layer.

6. The method of claim 4 wherein forming the second layer includes forming a polysilicon layer and forming the third layer includes forming a silicon nitride layer.

7. The method of claim 4 wherein forming spacers on the first mask includes forming polysilicon spacers on the first mask.

8. The method or claim 4 wherein removing the spacers includes removing the spacers with an etch that does not remove the third layer of the first mask, and removing the third layer of the first mask with an etch that does not remove the second layer of the first mask.

* * * * *